United States Patent
Hatem et al.

(10) Patent No.: US 10,541,137 B2
(45) Date of Patent: Jan. 21, 2020

(54) METHOD AND APPARATUS FOR NON LINE-OF-SIGHT DOPING

(71) Applicant: Varian Semiconductor Equipment Associates, Inc., Gloucester, MA (US)

(72) Inventors: Christopher R. Hatem, Seabrook, NH (US); Piero Sferlazzo, Marblehead, MA (US); Roger Fish, Bedford, MA (US); Dale K. Stone, Lynnfield, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/996,032

(22) Filed: Jun. 1, 2018

(65) Prior Publication Data

US 2019/0371608 A1    Dec. 5, 2019

(51) Int. Cl.
*H01L 21/22*     (2006.01)
*H01L 21/263*    (2006.01)
*H01L 21/8234*   (2006.01)

(52) U.S. Cl.
CPC .......... *H01L 21/22* (2013.01); *H01L 21/2636* (2013.01); *H01L 21/823431* (2013.01)

(58) Field of Classification Search
CPC .............................................. H01L 21/22–228
See application file for complete search history.

(56) References Cited

U.S. PATENT DOCUMENTS

| | | |
|---|---|---|
| 2006/0220133 A1 | 10/2006 | Yeo et al. |
| 2007/0087574 A1 | 4/2007 | Gupta et al. |
| 2009/0102019 A1* | 4/2009 | Haight .................. B82Y 10/00 257/607 |
| 2010/0167512 A1* | 7/2010 | Pan ..................... B81C 1/00698 438/549 |
| 2014/0004689 A1 | 1/2014 | Nainani et al. |
| 2015/0380285 A1 | 12/2015 | Huseinovic et al. |
| 2017/0069737 A1 | 3/2017 | Choi et al. |

OTHER PUBLICATIONS

International Search Report and Written Opinion dated Sep. 17, 2019 for International Application, PCT/US2019/033464 filed May 22, 2019.

* cited by examiner

*Primary Examiner* — Robert G Bachner
*Assistant Examiner* — Molly K Reida

(57) ABSTRACT

A method of doping a substrate. The method may include providing a substrate in a process chamber. The substrate may include a semiconductor structure, and a dopant layer disposed on a surface of the semiconductor structure. The method may include maintaining the substrate at a first temperature for a first interval, the first temperature corresponding to a vaporization temperature of the dopant layer. The method may further include rapidly cooling the substrate to a second temperature, less than the first temperature, and heating the substrate from the second temperature to a third temperature, greater than the first temperature.

14 Claims, 3 Drawing Sheets

METHOD AND APPARATUS FOR NON LINE-OF-SIGHT DOPING

FIELD

The present embodiments relate to methods of doping a substrate, and more particularly methods of three-dimensional doping.

BACKGROUND

As semiconductor devices such as logic and memory devices continue to scale to smaller dimensions, the use of conventional processing and materials to fabricate semiconductor devices is increasingly problematic. In one example, new approaches for doping semiconductor structures are being investigated to supplant ion implantation. For example, in future technology generations, transistors may be formed of three-dimensional structures, such as horizontal gate all around structures (HGAA) where active regions are formed using so-called nanowires. Doping of such nanowires becomes a challenge using known implantation techniques, since portions of the nanowire do not present line-of-sight surfaces easily accessed by implanting ions. Plasma immersion techniques may not be suitable for such structures where the dimensions may be on the order of nanometers or a few tens of nanometers. The growth of doped high quality epitaxial semiconductor layers to provide dopants on nanowires may also be difficult due to the geometry of nanowires, as well as the high level of dopant needed.

With respect to these and other considerations the present disclosure has been provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method of doping a substrate may include providing a substrate in a process chamber. The substrate may include a semiconductor structure, and a dopant layer disposed on a surface of the semiconductor structure. The method may include maintaining the substrate at a first temperature for a first interval, the first temperature corresponding to a vaporization temperature of the dopant layer. The method may further include rapidly cooling the substrate to a second temperature, less than the first temperature, and heating the substrate from the second temperature to a third temperature, greater than the first temperature.

In another embodiment, an apparatus for doping a substrate may include a process chamber, the process chamber comprising an interior wall. The apparatus may include a substrate holder, disposed within the process chamber, and a substrate heater assembly, disposed opposite the substrate holder, outside the process chamber. The apparatus may further include a controller, coupled to substrate heater assembly, and configured to send a set of control signals to the substrate heater assembly and the substrate holder. The control signals may cycle the substrate between a first substrate temperature and a second substrate temperature, wherein the substrate heater assembly is switched between an ON and OFF state and the substrate holder is simultaneously switched between a low thermal conductivity configuration and a high thermal conductivity configuration.

In another embodiment, a method of doping a substrate may include providing a substrate in a process chamber, the substrate comprising a semiconductor structure. The method may include providing a partial pressure of a condensing dopant species in the process chamber and heating the substrate to a first temperature for a first interval, the first temperature corresponding to a vaporization temperature of the condensing dopant species. The method may further include rapidly cooling the substrate to a second temperature, less than the first temperature, maintaining the substrate at the second temperature for a second interval; and heating the substrate from the second temperature to a third temperature, greater than the first temperature

DETAILED DESCRIPTION

Figure 1A:
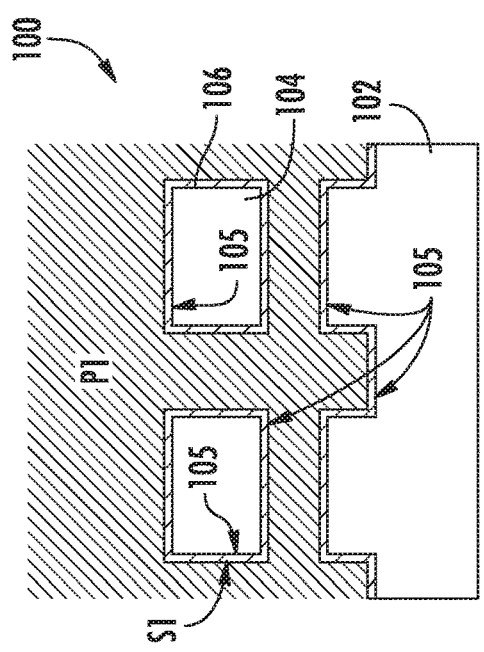
FIGS. 1A-1E illustrate exemplary operations involved in doping a substrate according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In the present embodiments, the present inventors have identified novel approaches to promote more uniform doping into a semiconductor structure, such as a three-dimensional semiconductor structure.

FIGS. 1A-1E illustrate exemplary operations involved in doping a substrate according to embodiments of the disclosure. Turning in particular to FIG. 1A, there is shown a first instance where a substrate 100 is provided. According to various embodiments the substrate 100 may be placed in a process chamber, where a gas mixture including a dopant species is present in the ambient surrounding the substrate. In the example shown, the substrate 100 includes a substrate base 102, and a semiconductor structure(s) 104.

In various embodiments, at least a portion of the substrate base 102 and the semiconductor structures 104 may be a semiconductor material, such as silicon, germanium, silicon carbide (SiC), or a silicon:germanium alloy. In other embodiments, the substrate base 102 may comprise a known group III-V compound semiconductor (e.g., GaAs, InGaAs) or group II-VI compound semiconductor (e.g., CdTe). The embodiments are not limited in this context.

The semiconductor structure 104 may exhibit three-dimensional features, as suggested in FIG. 1A. In some examples, a dopant layer 106 may be provided on the surface 105 of the semiconductor structure(s) 104 before placing in the process chamber. The dopant layer 106 may be a dopant such as boron, arsenic, or phosphorous. The embodiments are not limited in this context. The dopant layer 106 may be formed using known techniques, such as chemical vapor deposition (CVD), evaporation, furnace doping, and so forth. In other embodiments, no dopant layer is formed on the semiconductor structures 104 before placing the substrate 100 in a process chamber. When in the process chamber 302, an atmosphere may be provided in the ambient of the substrate 100, including dopant species corresponding to the dopant of dopant layer 106. In various embodiments the pressure within the process chamber 302 may be in the Torr or mTorr range. The process chamber 302 may include an atmosphere containing carrier gas such as argon and hydrogen in some embodiments. The substrate 100 may be maintained at a first temperature T1. According to various embodiments, the substrate 100 may be maintained at the temperature T1 over a first interval, corresponding to the vaporization temperature of the dopant species, meaning near the vaporization temperature or at the vaporization temperature. The dopant species may exhibit a dopant partial pressure, shown as P1, equivalent to the saturation vapor pressure at temperature T1. In accordance with various embodiments the dopant layer 106 may initially exhibit a non-uniform layer having a non-uniform thickness on the surface 105 of the semiconductor structure(s) 104. When placed in the chamber at the temperature T1, an instantaneous surface concentration S1 of dopant species is present. In the case where the dopant layer 106 is provided on the substrate 100 before placement in the process chamber 302, the surface concentration S1 is set by the presence of the dopant layer 106.

Figure 1B:
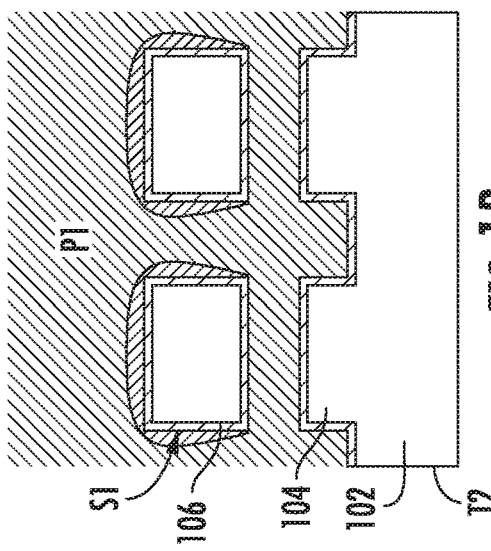

Turning to FIG. 1B there is shown a subsequent instance where the temperature of the substrate 100 is reduced to a temperature T2. At the temperature T2, the substrate may be maintained for a second interval in a partial pressure P1 of dopant species. During the second interval, at the lower substrate temperature, more dopant species may condense upon the semiconductor structure 104. The dopant species may form a non-uniform growth of the dopant layer 106, as shown. The non-uniform growth is not generated by temperature effects, rather is based upon the geometry of the semiconductor structures 104. The upper most portion of the semiconductor structure 104 may "see" all of the atmosphere in the process chamber, such as a plasma present above the substrate 100, while side walls and bottom surfaces may see 50% or less of the plasma and thus may experience less growth from condensing species received from the plasma.

Figure 1E:
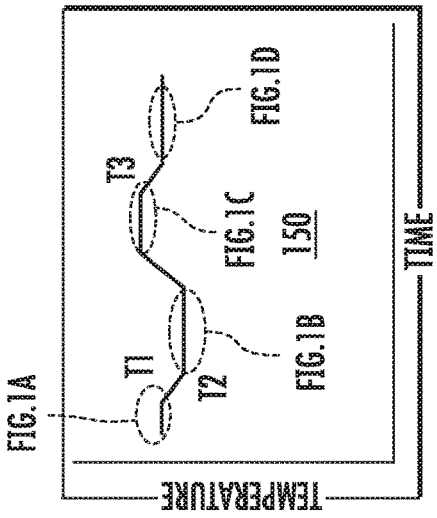
Figure 1C:
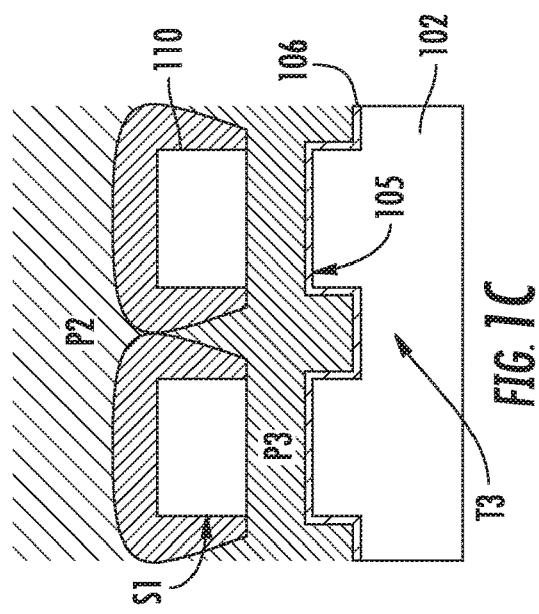
Figure 1D:
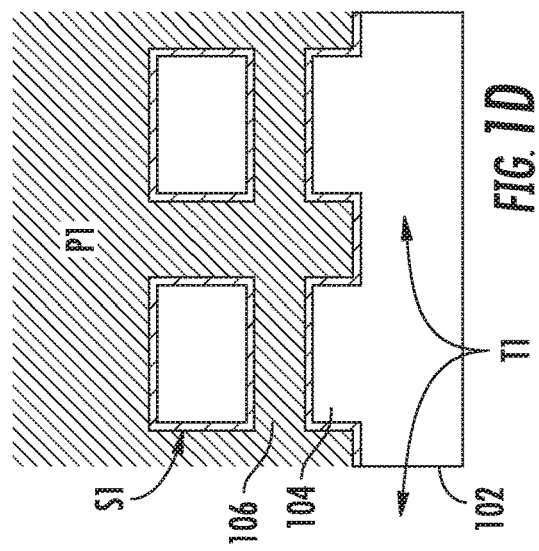

The non-uniform growth may proceed to the instance in FIG. 1C, as shown. At the instance of FIG. 1C, the substrate temperature is increased to a temperature T3, and may be held at the temperature T3 for a third interval. The anisotropic growth resulting in the structure of FIG. 1C may also result in different partial pressure of dopant species in different regions of the substrate. For example, a partial pressure P2, less than P1, may develop above the substrate 100, while a partial pressure P3, greater than P1, develops adjacent the semiconductor structures 104. In this scenario, material of dopant layer 106 near the top evaporates at a greater rate than material of the dopant layer toward the bottom. As evaporation continues, material of the dopant layer 106 redistributes on the surface 105, forming a uniform thickness of dopant layer 106, as shown in FIG. 1D. The substrate 100 may then be cooled to a lower temperature. In some examples, the third interval may last on the order of seconds, such as for arsenic deposition. The exact duration may vary with dopant and with partial pressure of dopant within the process chamber 302. In accordance with some embodiments, the substrate 100 may be exposed to processing where the operations of FIG. 1A to FIG. 1D are performed through multiple cycles, where a given cycle represents the operations of FIG. 1A to FIG. 1D in sequence. At the end of a last cycle the substrate 100 may be then brought to room temperature. An exemplary temperature profile, denoted as temperature profile 150, is shown in FIG. 1E. In some embodiments, T1 may be set at 200° C. for a duration of 30 seconds; followed by a temperature ramp down to T2, set at 150° C. for 30 seconds; a fast ramp up to a T3, set at a temperature of 250° C.–400° C., for a duration of 10 seconds; and a ramp down to a T4 of 150° C.–200° C. The exact temperatures and durations may vary according to dopant, targeted thickness of the dopant layer, and so forth. This cycle of T1-T4 may be repeated as needed. As such, the temperature profile 150 may represent a rapid cycling of substrate temperatures above and below the vaporization temperature at a given temperature and pressure within a process chamber.

FIGS. 2A-2D illustrate exemplary operations involved in doping a substrate according to further embodiments of the disclosure. In this example, a substrate 200 includes a substrate base 202, which base may represent any layer or combination of layers, a semiconductor layer 204, and a semiconductor structure 205, where the semiconductor structure 205 may represent at least one semiconductor material, or combination of materials, such as silicon, silicon; germanium alloy, and so forth. In various embodiments, the semiconductor structure 205 may be a monocrystalline semiconductor, or combination of monocrystalline semiconductors as known. The semiconductor structure 205 may represent one nanowire or a plurality of nanowires in a HGAA device structure. As such, the semiconductor structure 205 may represent a three-dimensional device structure, where a variety of different surfaces are present, facing a variety of different directions. In the particular illustration of FIG. 2A, the semiconductor structure 205 may include a plurality of different structures, shown as structure 206, structure 208, and structure 210. These structures may represent a plurality of nanowires, where the nanowires are shown in cross-section, suspended between different ends of a device (at positions that are in and out of the page of the figure), as will be appreciated by those of skill in the art.

Figure 2A:
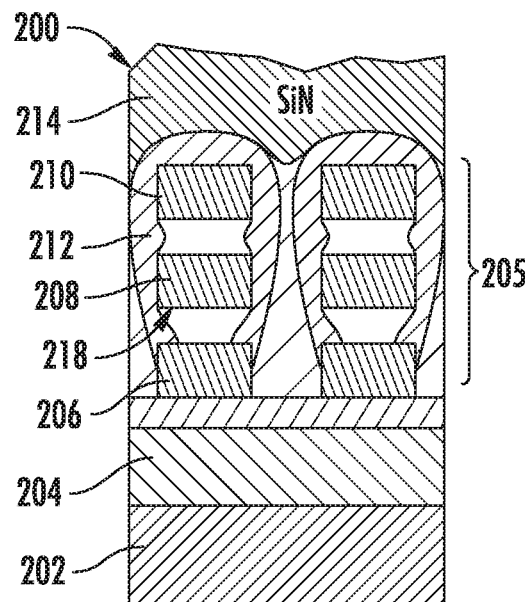
FIGS. 2A-2D illustrate exemplary operations involved in doping a substrate according to embodiments of the disclosure.
Figure 2B:
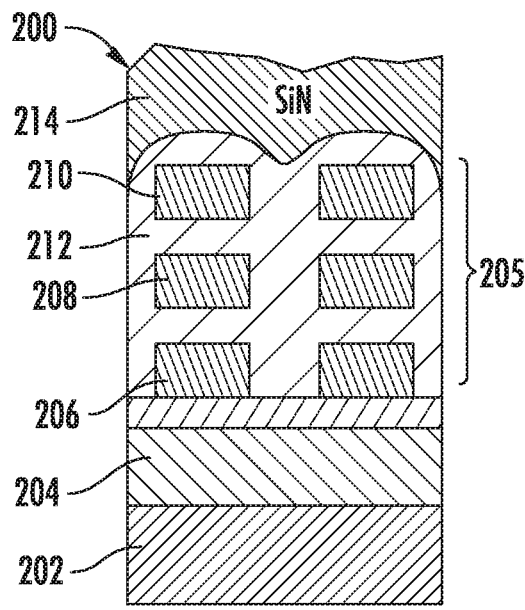
Figure 2C:
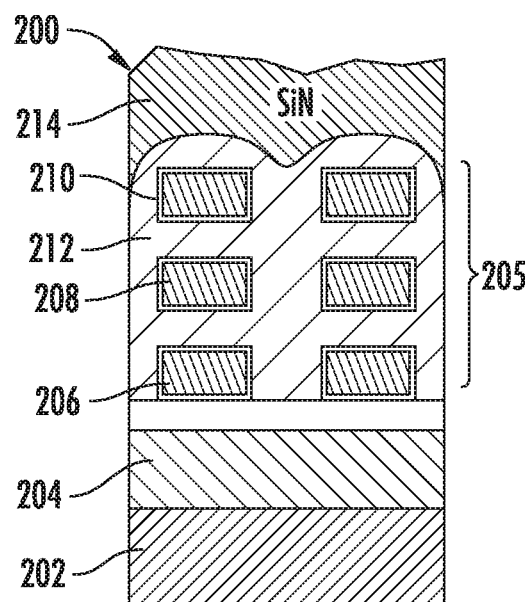

The sequence of FIGS. 2A-2C generally follows the sequence of operations outlined above in respective FIGS. 1B-1D. Said differently, FIG. 2A generally corresponds to the operation of FIG. 1B, FIG. 2B corresponds to the operation of FIG. 1C, while FIG. 2C corresponds to the operation of FIG. 1D. The corresponding operation of FIG. 1A is not shown. As shown in FIG. 2A, a dopant layer 212 is disposed on the semiconductor structure 205. The dopant layer 212 may be formed by known deposition processes, such as CVD or evaporation in some instances. Notably, the dopant layer 212 may be disposed in a non-uniform manner on the semiconductor structure 205, where the thickness of dopant layer 212 varies on different portions of the surface of semiconductor structure 205. For example, the semiconductor structures 205 may include hidden surfaces 218, where the hidden surfaces 218 have little or no dopant, as shown in FIG. 2A. The hidden surfaces 218 may represent surfaces, less directly facing a source of dopant material, where line-of-sight deposition of a dopant from dopant species in a process chamber does not occur on the hidden surfaces 218. Thus, dopant may be less likely to be initially formed on the hidden surfaces 218. Generally, the thickness of the dopant layer 212 may vary among different surfaces or along a given surface, whether or not the given surface is hidden from depositing flux. As such, the configuration of FIG. 2A does not present an ideal configuration for uniform doping of the various portions of the semiconductor structure 104. Notably, the substrate 200 may further include a capping layer 214, disposed over the semiconductor structure 104 and the dopant layer 212. In various embodiments, the capping layer 214 may include a suitable material to partially or entirely cover material below the capping layer 214. For example, the capping layer 214 may be a deposited layer of silicon nitride (SiN). The embodiments are not limited in this context.

According to various embodiments, the substrate 200 of FIG. 2A may be placed in a processing chamber, as generally described above with respect to FIG. 1A to FIG. 1D. Once placed in the processing chamber, the substrate 200 may be subject to a sequence of operations to more uniformly distribute dopant over the surface(s) of semiconductor structure 104. At the instance of FIG. 2A, the temperature may be held at T2, generally described above.

Turning to FIG. 2B, there is shown a subsequent instance where the structure of FIG. 1A is heated to a treatment temperature, such as T3, described above, where material of the dopant layer 212 redistributes over the surfaces of the semiconductor structure 205. At this treatment temperature, the condensed material of the dopant layer 212 may be in equilibrium with a partial pressure of dopant species formed in regions adjacent the semiconductor structure 205, under the capping layer 214.

Figure 2D:
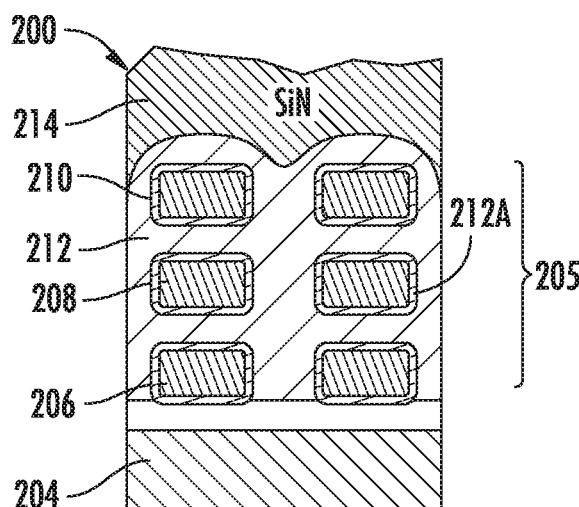

Turning to FIG. 2C, there is shown a subsequent instance where the temperature is adjusted to a lower treatment temperature. At this instance, the change in treatment temperature, such as T4, described above, causes condensation of more dopant species, with the resultant growth in thickness of the dopant layer 212. At the same time, the uniformity of the dopant layer 212 over the different surfaces of the semiconductor structure 205, including hidden surfaces 218, is improved with respect to the starting structure of FIG. 2A. Subsequent to the instance of FIG. 2C, an annealing or drive-in operation may be performed by heating the substrate 200 to drive material of the dopant layer 212 into the different portions of the semiconductor structure 205, forming a uniformly doped structure, as shown in FIG. 2D by the doped regions 212A.

Figure 3:
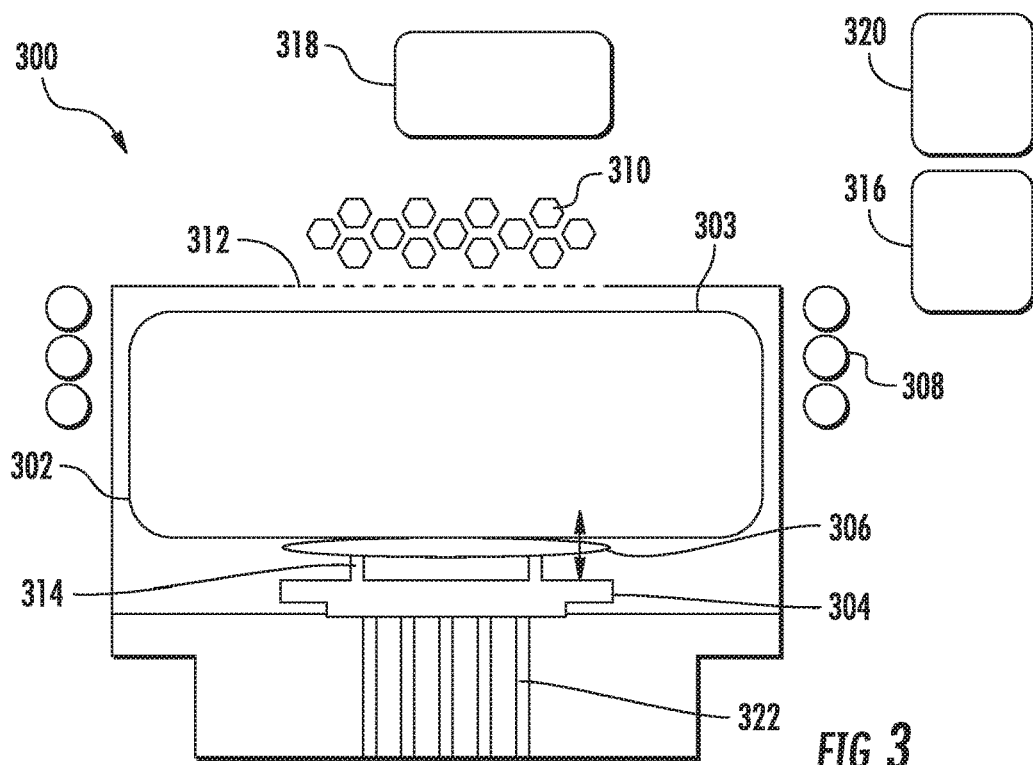
FIG. 3 illustrates an exemplary process system according to some embodiments of the disclosure.

Turning to FIG. 3 there is shown a processing apparatus 300, arranged according to additional embodiments of the disclosure. The processing apparatus 300 includes a novel arrangement of components adapted to provide the ability to dope a semiconductor substrate according to the embodiments of FIGS. 1A-2D. The processing apparatus 300 may include a process chamber 302, where the process chamber may include an interior wall, shown as interior heated wall 303. The processing apparatus 300 may also include a substrate holder 304, disposed within the process chamber 302, and a substrate heater assembly 310, disposed opposite the substrate holder 304, outside the process chamber 302. The substrate heater assembly 310 may be a lamp assembly, such as light emitting diodes, or other lamps. The processing apparatus 300 may also include a process chamber window 312, disposed between the substrate heater assembly 310 and the substrate holder 304. The process chamber window 312 may be designed to transmit the appropriate wavelengths of light, as emitted by the substrate heater assembly 310, to impinge upon a substrate 306. As such, the substrate heater assembly 310 may be especially suited for rapidly heating the substrate 306.

The processing apparatus 300 may further include a dopant source 316, to supply dopants, such as in the form of precursor species, to the process chamber 302. The processing apparatus 300 may further include a plasma generation assembly 308, where the plasma generation assembly 308 may include a power source, as well as applicator, such as a radio frequency (RF) applicator to apply RF power for generating a plasma in the process chamber, as known in the art. The processing apparatus 300 may further include a gas manifold 320, arranged to provide at least one carrier gas to the process chamber 302. When a dopant species and carrier gas are provided to the process chamber 302, the plasma generation assembly 308 may be energized to generate a plasma or to otherwise activate the dopant species to produce an ambient including condensing species of the dopant. In other embodiments, condensing species of a dopant may be generated remotely from the process chamber 302 and may be conducted into the process chamber 302 to establish a designed partial pressure of condensing dopant species. The partial pressure may be controlled independently of gas flow, temperature, and so forth. In various embodiments, the temperature of the chamber walls of process chamber 302 may be higher than the vaporization temperature of the dopant species in question to prevent condensation on chamber walls. Alternatively, the chamber walls may be unheated, such as at room temperature, where condensation may take place, entailing periodic cleaning of the process chamber 302.

In order to conveniently and rapidly cycle between different states for processing a substrate 306, the processing apparatus 300 may further include a controller 318, coupled to at least the substrate heater assembly 310. The controller 318 may include any combination of software and hardware, and may be used to adjust heating of the substrate, as well as the configuration of the substrate holder 304. For example, the controller 318 may send a set of control signals to the substrate heater assembly 310 and the substrate holder 304 to cycle the substrate 306 between a first substrate temperature and a second substrate temperature, where the substrate heater assembly 310 is switched between an ON and OFF state. At the same time, the set of control signals may switch the substrate holder 304 between a low thermal conductivity configuration and a high thermal conductivity configuration. The control signals to turn off and on a substrate heater assembly 310 may be synchronized by the controller 318 with control signals to switch the substrate holder 304 between the high thermal conductivity configuration and the low thermal conductivity configuration. This synchronization of operation of the substrate heater assembly 310 with operation of the substrate holder 304 may increase the rate of cooling or rate of heating of the substrate 306 between different substrate temperatures.

As shown in FIG. 3, the processing apparatus 300 may include a gas transport assembly 322, coupled to the substrate holder 304, where the controller 318 is configured to send a gas control signal to conduct gas to the substrate holder using the gas transport assembly 322 to establish the high thermal conductivity configuration. As such, a thermally conductive gas may be directed to backside regions of the substrate holder 304 via the gas transport assembly 322 when the substrate heater assembly 310 is switched to an OFF state. While the substrate heater assembly 310 is in an ON state, and the substrate 306 is being actively heated, the gas may be prevented from circulating through the gas transport assembly 322. By providing a thermally conductive gas, such as helium or other known conductive gas, to the substrate holder 304 at the time when the substrate heater assembly 310 is switched OFF, the substrate temperature may accordingly decrease more rapidly to a second temperature. In particular, the substrate 306 may be rapidly cooled below the vaporization temperature of a given dopant to enhance the condensation of dopant on all surfaces of a semiconductor structure, including hidden surfaces or regions where less dopant was initially present.

Alternatively, or in addition, the processing apparatus 300, and the substrate holder 304 in particular, may include a lift assembly 314. The controller 318 may be configured to send a lift control signal to move the lift assembly 314 to establish a high thermal conductivity configuration when the substrate heater assembly 310 is switched OFF. For example, a high thermal conductivity configuration of the substrate holder 304 may be a configuration where the substrate 306 is held adjacent to a planar surface of the substrate holder 304, where the lift assembly is retracted. A low thermal conductivity configuration may be a configuration, where lift pins of the lift assembly 314 are extended, placing the substrate 306 above the planar surface of the substrate holder 304, and thus reducing thermal contact with the substrate holder 304. Thus, the lift pins may be extended when the substrate heater assembly 310 is in an ON state. Notably, to accurately control substrate temperature, and depending upon the exact substrate temperature to be imparted to substrate 306, the substrate heater assembly 310 may be adjusted between a plurality of different heating levels. Thus, the substrate heater assembly 310 may be placed in different ON states to establish different substrate temperatures, while the power to lamps of the substrate heater assembly 310 is adjusted between the different ON states.

Figure 4:
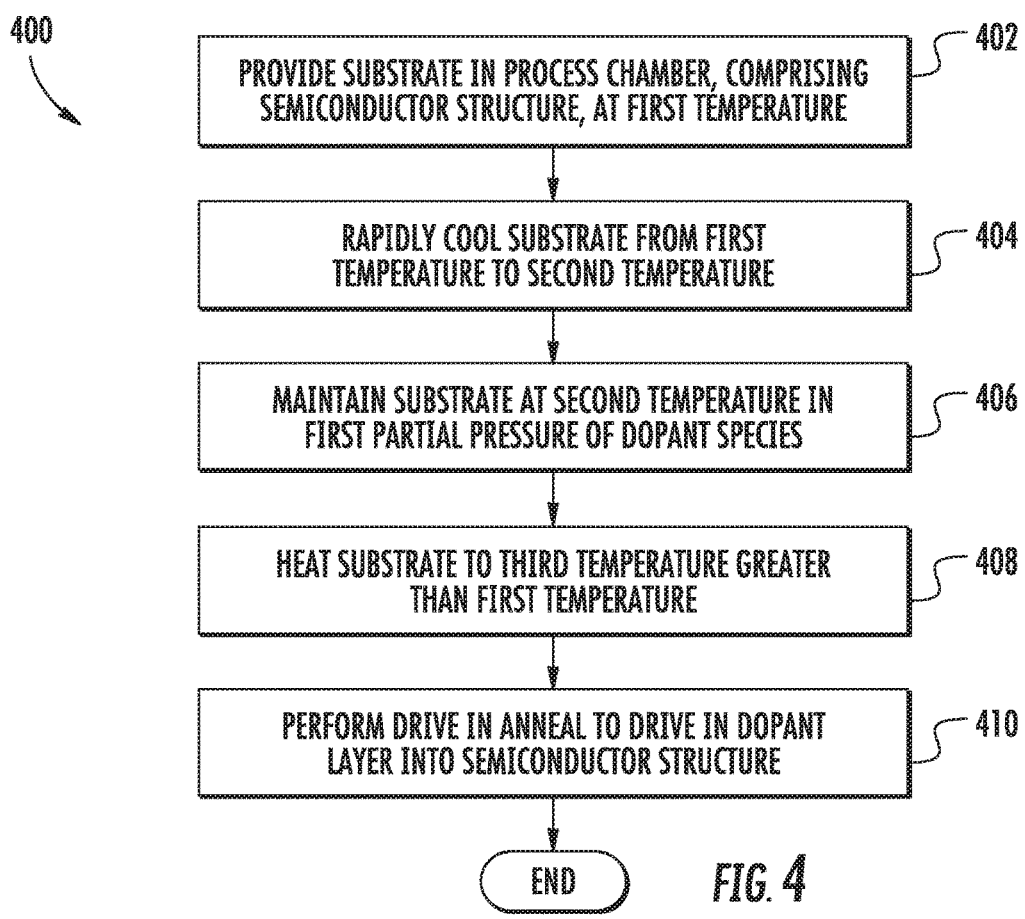
FIG. 4 depicts an exemplary process flow.

FIG. 4 depicts an exemplary process flow 400 according to embodiments of the disclosure. At block 402, a substrate is provided in a process chamber at a first substrate temperature, where the substrate includes a semiconductor structure. The process chamber may include an interior chamber wall, heated to maintain a wall temperature greater than the substrate temperature, while the substrate is in the process chamber. In some embodiments, the substrate may be provided on a substrate holder capable of providing two or more configurations where the thermal coupling to a cooling medium is varied. In some embodiments, a first partial pressure of a dopant species may be provided in the substrate temperature while the substrate is held at the first temperature. According to some embodiments, a dopant layer may be deposited on the semiconductor structure before placement of the substrate in the process chamber.

At block 404, the substrate is rapidly cooled to a second temperature, below the first temperature. At block 406, the substrate is maintained at the second temperature in the first partial pressure of the dopant species. Because of the lower temperature, condensation of dopant species may take place on portions of the semiconductor structure, leading to non-uniform growth of a dopant layer on the semiconductor structure.

At block 408, the substrate is heated to a third temperature, greater than the first temperature. According to some embodiments, at the third temperature, dopant species may evaporate from the semiconductor structure in a non-uniform manner, leading to a more uniform distribution of dopant thickness in the dopant layer across the different surfaces of the semiconductor structure. In some embodiments, depending upon the dopant of the dopant layer, the third temperature may range between 170 C and 200 C. At block 410, a drive in annealing procedure is performed to drive in the uniform dopant layer into the different surfaces of the semiconductor structure.

The present embodiments provide the advantage of a technique to increase dopant uniformity on surfaces of semiconductor structures, while not depending upon any particular initial distribution of dopant on the different surfaces. The embodiments provide the additional advantage of facilitating uniform doping of three-dimensional semiconductor structures, including finFET, HGAA, nanowires, and the like. The present approaches accordingly relax know conformality requirements for doping three dimensional structures, calling for uniform initial dopant distribution over different surfaces of a three-dimensional structure in order to achieve a uniform doping within such structures.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, while the present disclosure has been described herein in the context of a particular implementation in a particular environment for a particular purpose, those of ordinary skill in the art will recognize the usefulness of the present embodiments is not limited thereto and the present embodiments may be beneficially implemented in any number of environments for any number of purposes. Thus, the claims set forth below are to be construed in view of the full breadth and spirit of the present disclosure as described herein.

What is claimed is:

1. A method of doping a substrate, comprising:
providing a substrate in a process chamber, the substrate comprising a semiconductor structure, and a dopant layer disposed on a surface of the semiconductor structure, wherein the substrate is maintained at a first temperature for a first interval, the first temperature corresponding to a vaporization temperature of the dopant layer;
rapidly cooling the substrate to a second temperature, less than the first temperature; and
heating the substrate from the second temperature to a third temperature, greater than the first temperature.

2. The method of claim 1, wherein the substrate is held at the second temperature for a second interval, wherein the dopant layer forms a non-uniform thickness on the surface of the semiconductor structure.

3. The method of claim 2, wherein the substrate is held at the third temperature for a third interval, wherein the dopant layer forms a uniform distribution on the surface of the semiconductor structure.

4. The method of claim 1, wherein the dopant layer has a first thickness upon a hidden surface of the semiconductor structure before the heating the substrate to the first temperature, and wherein the dopant layer has a second thickness upon the hidden surface of the semiconductor structure after the heating the substrate to the third temperature, the second thickness being greater than the first thickness.

5. The method of claim 3, wherein during the first interval, the process chamber comprises a first dopant partial pressure of the dopant, and wherein during the third interval, a second dopant partial pressure is generated above the substrate, less than the first dopant partial pressure, and wherein a third dopant partial pressure is generated locally adjacent to the semiconductor structure, the third dopant partial pressure being greater than the second dopant partial pressure.

6. The method of claim 5, further comprising maintaining a chamber wall of the process chamber at a fourth temperature, greater than the third temperature, during the first interval, the second interval, and the third interval.

7. The method of claim 1, wherein the substrate further comprises a capping layer, disposed over the semiconductor structure and the dopant layer.

8. The method of claim 3, the method further comprising rapidly cooling the substrate after the third interval.

9. The method of claim 8, wherein the substrate is disposed in contact with a substrate holder in the process chamber, wherein the substrate is disposed at a first position, having a first thermal contact with the substrate holder and is heated by a substrate heater during the third interval, the rapidly cooling comprising:
  moving the substrate to a second position, wherein the substrate is in a second thermal contact with the substrate holder, greater than the first thermal contact; and
  turning off the substrate heater.

10. A method of doping a substrate, comprising:
  providing a substrate in a process chamber, the substrate comprising a semiconductor structure;
  providing a partial pressure of a condensing dopant species in the process chamber;
  heating the substrate to a first temperature for a first interval, the first temperature corresponding to a vaporization temperature of the condensing dopant species;
  rapidly cooling the substrate to a second temperature, less than the first temperature;
  maintaining the substrate at the second temperature for a second interval; and
  heating the substrate from the second temperature to a third temperature, greater than the first temperature, and maintaining the substrate at the third temperature for a third interval.

11. The method of claim 10, wherein the first temperature is 175° C. to 225° C., and wherein the second temperature is 130° C. to 170° C., and wherein the third temperature is 250° C. to 400° C.

12. The method of claim 10, further comprising cooling the substrate from the third temperature to a fourth substrate temperature, after the third interval, and maintaining the substrate at the fourth substrate temperature for a fourth interval.

13. The method of claim 10, wherein a first duration of the first interval is 20 seconds to 40 seconds, a second duration of the second interval is 20 seconds to 40 seconds, and wherein a third duration of the third interval is 5 seconds to 15 seconds.

14. The method of claim 10, wherein the substrate is rapidly cycled between the second temperature and the third temperature.

* * * * *